US009632869B1

(12) United States Patent
 Lu et al.

(10) Patent No.: US 9,632,869 B1
(45) Date of Patent: Apr. 25, 2017

(54) ERROR CORRECTION FOR INTERCONNECT CIRCUITS

(71) Applicant: Xilinx, Inc., San Jose, CA (US)

(72) Inventors: Ting Lu, Austin, TX (US); Nishit Patel, San Jose, CA (US); Ahmad R. Ansari, San Jose, CA (US); James J. Murray, Constantia (ZA); Sagheer Ahmad, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 41 days.

(21) Appl. No.: 14/848,070

(22) Filed: Sep. 8, 2015

(51) Int. Cl.
 G06F 12/00 (2006.01)
 G06F 13/16 (2006.01)
 G06F 11/10 (2006.01)
 G11C 29/52 (2006.01)

(52) U.S. Cl.
 CPC .......... *G06F 11/1068* (2013.01); *G11C 29/52* (2013.01)

(58) Field of Classification Search
 CPC ................ G06F 11/1044; G06F 11/20; G06F 2003/0697; G06F 9/30036; H03M 13/05
 See application file for complete search history.

(56) References Cited

U.S. PATENT DOCUMENTS

| 5,530,673 | A * | 6/1996 | Tobita | G06F 3/0601 365/185.04 |
| 6,240,469 | B1 * | 5/2001 | Ishibashi | G06F 13/124 386/332 |
| 6,732,208 | B1 * | 5/2004 | Alsaadi | G06F 12/0831 710/107 |
| 6,938,133 | B2 * | 8/2005 | Johnson | G06F 13/1642 710/309 |
| 2005/0193166 | A1 * | 9/2005 | Johnson | G06F 13/1642 711/114 |
| 2007/0260914 | A1 * | 11/2007 | Pogrebinsky | G06F 11/0745 714/5.11 |
| 2008/0098277 | A1 * | 4/2008 | Hazelzet | H03M 13/19 714/753 |
| 2014/0237205 | A1 * | 8/2014 | Takefman | H03M 13/05 711/162 |

OTHER PUBLICATIONS

U.S. Appl. No. 14/527,469 Arbel et al., filed Oct. 29, 2014 San Jose, CA USA.

* cited by examiner

*Primary Examiner* — Phung M Chung
(74) *Attorney, Agent, or Firm* — LeRoy D. Maunu (57) ABSTRACT

In approaches for correction of errors introduced in an interconnect circuit, an ECC proxy circuit is coupled between a first interconnect and the second interconnect, and generates for each of the write transactions from a bus master circuit, a first ECC from and associated with data of the write transaction, and transmits the write transaction and associated first ECC on the second interconnect. The ECC proxy circuit also supplements each of the read transactions from the bus master circuit with a reference to a second ECC associated with data referenced by the read transaction. The ECC proxy circuit transmits the read transaction that references the second ECC on the second interconnect. At least one random access memory (RAM) is coupled to the ECC proxy circuit through the second interconnect. The RAM stores data of each write transaction and the first ECC.

20 Claims, 9 Drawing Sheets

ERROR CORRECTION FOR INTERCONNECT CIRCUITS

FIELD OF THE INVENTION

The disclosure generally relates to detecting and correcting data errors introduced in interconnect circuits and in memory were the data is stored.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Some programmable ICs include hardwired microprocessors on the same chip or in the same package as the programmable interconnect and programmable logic and are sometimes referred to as a system on a chip (SoC). Applications built on SoCs will generally include numerous connections between the microprocessor, programmable logic, and memory and peripheral resources. The connections may be implemented as a number of interconnect busses.

SUMMARY

In one embodiment, a circuit arrangement includes a first bus master circuit, first and second interconnects, and an error correcting code (ECC) proxy circuit. The first bus master circuit is coupled to the first interconnect and is configured and arranged to initiate read transactions and write transactions. The ECC proxy circuit is coupled between the first interconnect and the second interconnect. The ECC proxy circuit is configured and arranged to generate, in response to each of the write transactions, a first ECC from and associated with data of the write transaction, and transmit the write transaction and associated first ECC on the second interconnect. The ECC proxy circuit also supplements, in response to each of the read transactions, the read transaction with a reference to a second ECC associated with data referenced by the read transaction, and transmits the read transaction that references the second ECC on the second interconnect. The circuit arrangement further includes at least one random access memory (RAM) coupled to the ECC proxy circuit through the second interconnect. The RAM is configured and arranged to store data of each write transaction and the first ECC, and read the data referenced by each read transaction and the second ECC.

In another embodiment, a method of processing bus transactions is provided. The method includes transmitting read transactions and write transactions from a first bus master circuit over a first interconnect coupled to the first bus master circuit. The read and write transactions are received by an error correction code (ECC) proxy circuit that is coupled between the first interconnect and a second interconnect. The ECC proxy circuit generates, in response to each of the write transactions, a first ECC from and associated with data of the write transaction, and transmits the write transaction and associated first ECC on the second interconnect. In response to each of the read transactions, the ECC proxy circuit supplements the read transaction with a reference to a second ECC associated with data referenced by the read transaction, and transmits the read transaction that references the second ECC on the second interconnect. The method stores data of the write transaction and the first ECC in at least one random access memory (RAM) coupled to the ECC proxy circuit through the second interconnect, and reads data referenced by the read transaction and the second ECC from the RAM.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION OF THE DRAWINGS

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Most SOC applications require resilience against errors that may create erroneous results or cause system failure. For example, many systems have built-in protection, such as circuitry or software that uses error-correcting codes (ECCs) to correct single event upsets (SEUs). In an SOC, a unit such as a memory controller protects data in memory using ECCs. However, a processor or other logic circuit on the SOC may be coupled to the memory controller through interconnect circuitry that includes one or more interconnects, such as bus circuits and/or switch circuits, and an error introduced in the interconnect circuitry would not be remedied by the memory controller.

The disclosed circuits provide detection and correction of errors that might occur in the interconnect circuitry between a bus master circuit and a memory. The disclosed approaches are suitable for applications in which implementing error-check circuitry within the interconnect circuitry is difficult or unfeasible. In the disclosed circuit arrangement, an ECC proxy circuit is coupled between two interconnects. ECC Proxy circuit eliminates the need of local ECC on memory controller as it provides that coverage. One or more bus master circuits are coupled to one of the interconnects, and each bus master circuit issues read and write transactions that target a RAM. The ECC proxy circuit receives the read and write transactions from the interconnect and generates ECCs, such as Hamming codes, for write transactions. In a write transaction, the ECC may be generated from the payload data or from both the payload data and the address and control information in the transaction. The payload data is the data the bus master circuit specified to write in the RAM at the target address. In one implementation, the ECC proxy circuit may extend a write transaction to include the ECC. In another implementation, the ECC proxy circuit may generate a supplemental write transaction. The ECC may be stored in the same memory and at the same address as the payload data, at a different address of the same memory as the payload data, or in a different memory from the payload data. For a read transaction, the ECC proxy circuit supplements the read transaction to reference the ECC associated with the referenced data. The reference to the ECC may be in the form of extended addressing in the read transaction in order to reference both the specified data and the ECC. Alternatively, the reference to the ECC may be in the form of a supplemental read transaction that references the address at which the ECC is stored.

Figure 1:
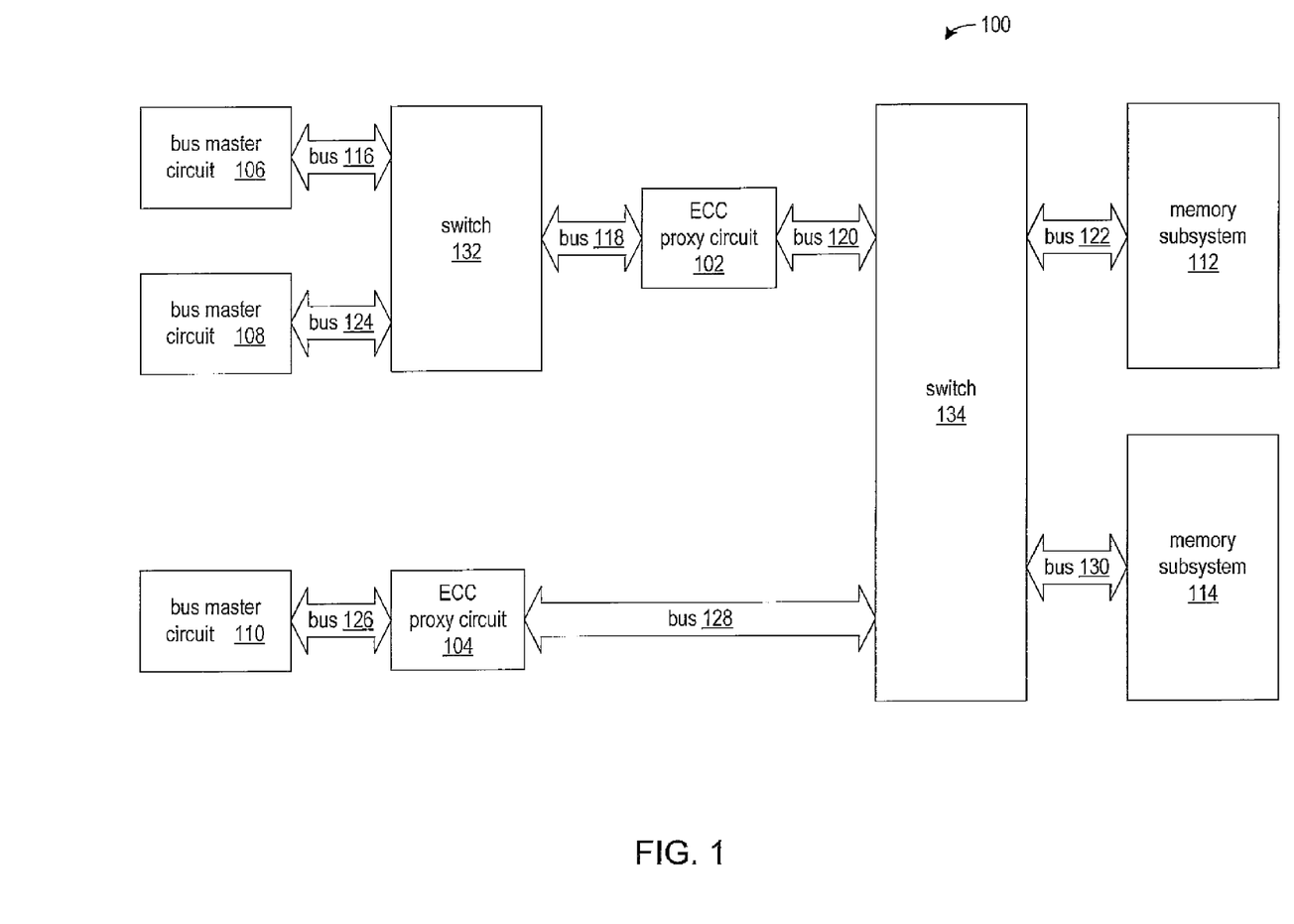
FIG. 1 shows a system in which one or more ECC proxy circuits may be deployed to provide error protection within interconnect circuits of the system.

FIG. 1 shows a system 100 in which one or more ECC proxy circuits 102 and 104 may be deployed to provide error protection over interconnect circuitry of the system. The system further includes bus master circuits 106, 108, and 110 and memory subsystems 112 and 114. The bus master circuits are coupled to the memory subsystems through interconnect circuitry that includes bus circuits 116, 118, 120, 122, 124, 126, 128, and 130, ECC proxy circuits 102 and 104, and switches 132 and 134.

Each of the bus master circuits 106, 108, and 110 is configured and arranged to initiate read and write transactions to the memory subsystems 112 and 114. Each of ECC proxy circuits 102 and 104 is coupled between a pair of bus circuits on the path from the bus master circuits to the memory subsystems 112 and 114 in order to intercept the read and write transactions and supplement the transactions with ECCs. The ECC proxy circuits may be connected at different locations in the interconnect circuitry. For example, ECC proxy circuit 102 is coupled between switches 132 and 134, and ECC proxy circuit 104 is not coupled to switch 132.

ECC proxy circuit 102 receives transactions from the bus master circuits 106 and 108 via bus circuit 118, and transmits supplemented transactions to the memory subsystems 112 and 114 via bus circuit 120. The ECC proxy circuit 102 receives responses from the memory subsystems 112 and 114 via bus circuit 120 and transmits the responses to the bus master circuits 106 and 108 via bus circuit 118. Similarly, ECC proxy circuit 104 receives transactions from bus master circuit 110 via bus 126 and transmits supplemented transactions to the memory subsystems 112 and 114 via bus circuit 128. The ECC proxy circuit 104 receives responses from the memory subsystems 112 and 114 via bus circuit 128 and transmits the responses to the bus master circuit 110 via bus circuit 126.

The placement of an ECC proxy circuit in the interconnect circuitry may depend on the bandwidth of the ECC proxy circuit and the required throughput for read and write transactions. For example, the placement of ECC proxy circuit 104 in the interconnect circuitry has the ECC proxy circuit servicing transactions from only bus master circuit 110. In contrast, the placement of ECC proxy circuit 102 in the interconnect circuitry has the ECC proxy circuit servicing transactions from both bus master circuit 106 and bus master circuit 108.

Each of the ECC proxy circuits 102 and 104 is configured and arranged to supplement the read and write transactions to handle ECCs. The ECC proxy circuit generates an ECC for each received write transaction. The ECC may be generated from payload data of the transaction or from both the payload and address and control information in the transaction. In one implementation, the ECC proxy circuit may extend the write transaction to include the ECC in the same transaction as the payload data. Alternatively, the ECC proxy circuit may generate a supplemental write transaction that specifies writing the ECC to an address different from the target address of the original write transaction.

For a read transaction, the ECC proxy circuit supplements the transaction with a reference to the ECC that is associated with the data at the target address of the read transaction. In one implementation, the ECC proxy circuit extends the read transaction to reference the ECC associated with the addressed data. In an alternative implementation, the ECC proxy circuit generates a supplemental read transaction to read from another address the ECC associated with the addressed data in the original read transaction.

Each ECC proxy circuit detects and corrects errors in responses to read transactions. In an implementation in which the ECC is read in the same transaction as the requested data of the read transaction, the ECC proxy circuit uses the ECC code returned in the response to detect and correct an error in the data of the response. In an implementation in which the ECC is read in a supplemental transaction that is separate from the read transaction, the ECC proxy circuit associates the transaction identifiers (IDs) of the supplemental transaction and the read transaction. The transaction IDs are used by the ECC proxy circuit to determine the response that has the ECC for the response having the requested data.

The data and ECCs generated by the ECC proxy circuits 102 and 104 may be stored in the same memory or in separate memories. System 100 includes memory subsystems 112 and 114. Each memory subsystem has a dedicated memory controller (not shown) that controls access to the RAM of the memory subsystem. The RAM may be DRAM, SRAM, or flash memory, for example. For data stored in memory subsystem 112, ECC proxy circuit 102 may store the associated ECCs also in memory subsystem 112 or may store the associated ECCs in memory subsystem 114. Similarly, for data stored in memory subsystem 112, ECC proxy circuit 104 may store the associated ECCs also in memory subsystem 112 or may store the associated ECCs in memory subsystem 114. ECC proxy circuits 102 and 104 may use different memories for data and ECCs. For example, ECC proxy circuit 102 may use memory subsystem 112 for data and memory subsystem 114 for ECCs, and ECC proxy circuit 104 may use memory subsystem 114 for data and memory subsystem 112 for ECCs. In another implementation, each of the ECC proxy circuits may include a local RAM for storing ECCs associated with data stored in the memory subsystems 112 and 114. Storing data and ECCs in separate memories allows the data and ECCs to be read in parallel, which may improve system performance.

Each ECC proxy circuit may include additional memory (not shown) and logic circuitry for selectively generating ECCs and reading ECCs. That is, memory in the ECC proxy circuit may be configured with one or more address ranges. Each address range references addresses in one or more of the memory subsystems 112 and 114, for example. In response to the target address in a write transaction being within one of the ranges, the ECC proxy circuit generates an ECC as described above. If the target address is not within one of the ranges, the ECC proxy circuit bypasses generating an ECC. In response to the target address in a read transaction being within one of the ranges, the ECC proxy circuit supplements the read transaction to obtain the associated ECC as described above. If the target address is not within one of the ranges, the ECC proxy circuit bypasses supplementing the read transaction.

In the example system 100, the interconnect circuitry includes interconnects and switches. The ECC proxy circuits are not limited at a particular bus protocol. The interconnects may implement AXI, APB, CORECONNECT™, AVALON® or any other protocol suitable for system requirements. The switches may be crossbar switches, for example.

Figure 2:
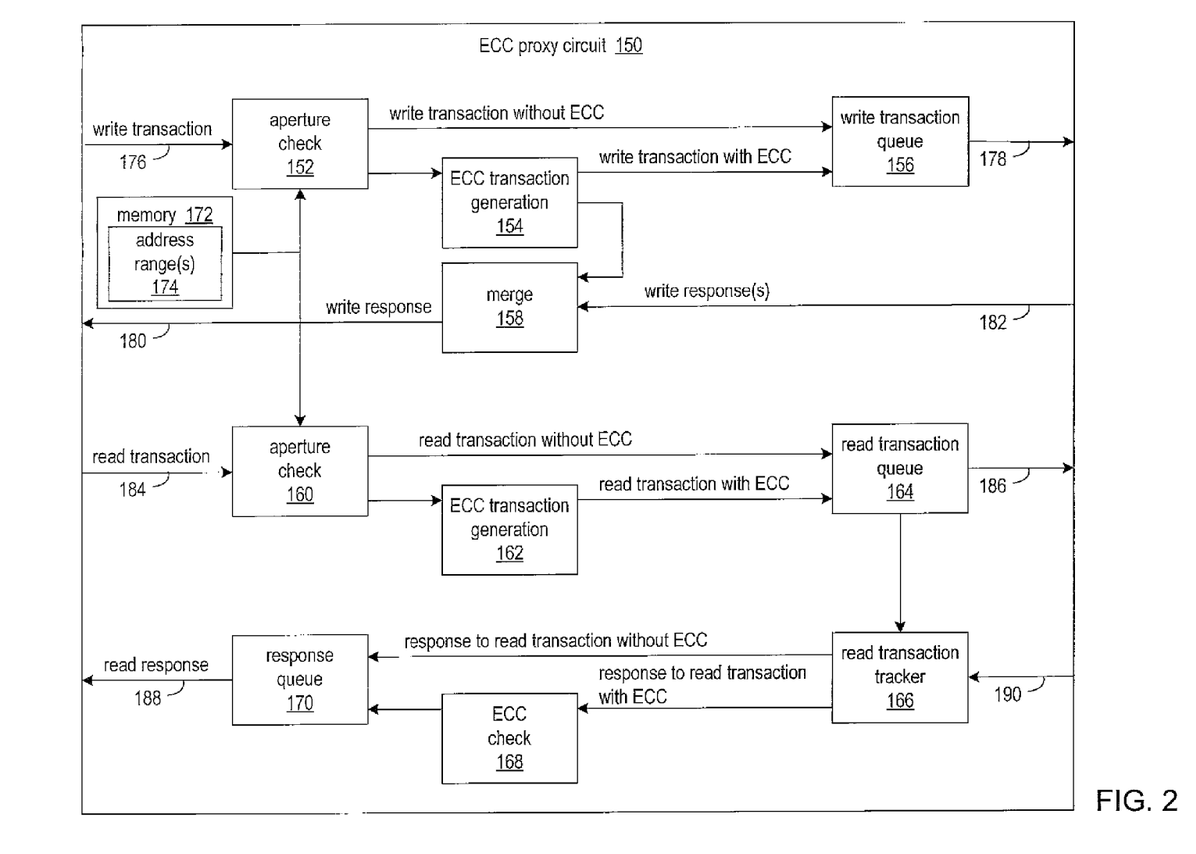
FIG. 2 shows an ECC proxy circuit according to one implementation.

FIG. 2 shows an ECC proxy circuit 150 according to one implementation. The ECC proxy circuit generally implements a write path and a read path. The write path includes aperture check circuit 152, ECC transaction generation circuit 154, write transaction queue 156, and merge circuit 158. The read path includes aperture check circuit 160, ECC transaction generation circuit 162, read transaction queue 164, read transaction tracker circuit 166, ECC check circuit 168, and response queue 170. The memory 172 is shared by the aperture check circuits 152 and 160 and may be configured, such as through configuration channels of a programmable IC, with one or more ranges of addresses 174. The aperture check circuits 152 and 160 and memory 172 are optional and may be omitted in implementations in which ECCs are generated and checked for all addresses. A separate bus interface circuit (not shown) may be included in the ECC proxy circuit for different bus protocols. In the illustrated implementation, the aperture check circuit 152 and write transaction queue 156 are connected to write transaction channels 176 and 178, respectively, merge circuit 158 is connected to write response channels 180 and 182, aperture check circuit 160 and read transaction queue 164 are connected to read transaction channels 184 and 186, respectively, and response queue 170 and read transaction tracker 166 are connected to read response channels 188 and 190, respectively. Low-level control and response signal lines are omitted from the diagram in order to avoid obscuring pertinent aspects.

The aperture check circuit 152 receives a write transaction on the write transaction channel 176. The aperture check circuit 152 compares the target address in the write transaction to the address ranges in the memory 172. If the target address is within one of the address ranges, the aperture check circuit signals the ECC transaction generation circuit 154 to generate an ECC for the write transaction. The ECC may be generated based only on the payload data of the write transaction, or based on the payload data and address and control information of the transaction. The ECC transaction generation circuit may be implemented to extend the write transaction with the ECC or implemented to generate a supplemental write transaction. In extending a write transaction, the aperture check circuit 152 provides a different write address at which the data and associated ECC are to be stored, and the ECC transaction generation circuit changes the address in the write transaction and adds the ECC to the payload of the write transaction. For extending write transactions, the aperture check circuit 152 maps write addresses provided by a bus master circuit to different addresses at which the data and ECCs are stored. In generating a supplemental write transaction, the original write transaction is stored in the write transaction queue 156 without an ECC, and a separate supplemental transaction is generated and has a target address that is different from the target address of the original write transaction. The supplemental write transaction is stored in the write transaction queue 156. If the target address is not within one of the address ranges, the write transaction is stored in the write transaction queue without an accompanying ECC. The write transaction queue outputs write transactions on the write channel 178 according to the bus protocol.

The merge circuit 158 may be employed in an implementation of the ECC proxy circuit in which supplemental ECC write transactions are generated. For a write transaction from a bus master circuit to be deemed successful, both the writing of data of the write transaction initiated by the bus master circuit and the writing of the ECC of the supplemental write transaction must be successful. The merge circuit 158 associates transaction IDs of original write transactions and supplemental write transactions provided by the ECC transaction generation circuit 154. If either the response having the transaction ID of the original write transaction or the response having the transaction ID of the associated supplemental write transaction indicate an error, the merge circuit provides an error response on write response channel 180.

Aperture check circuit 160 receives read transactions on read transaction channel 184. The aperture check circuit 160 compares the target address in the read transaction to the address ranges in the memory 172. If the target address is within one of the address ranges, the aperture check circuit signals the ECC transaction generation circuit 166 to supplement the read transaction to reference the associated ECC. In one implementation the ECC transaction generation circuit 162 modifies the read transaction to also read the associated ECC. For example, in an implementation in which write transactions are extended, the read transaction may be modified to change the target address according to the mapped address provided by the aperture check circuit 160 and to increase the byte count of the transaction and read the ECC along with the referenced data. The modified read transaction is stored in the read transaction queue 164.

In another implementation, the ECC transaction generation circuit 162 generates a supplemental read transaction to read the ECC associated with the referenced data in the received read transaction. ECC transaction generation circuit 162 generates a supplemental read transaction based on the target address of the received read transaction. The addressing scheme employed by the ECC transaction generation circuit 154 for writing an ECC is also employed by the ECC transaction generation circuit 162 for reading an ECC. For example, the ECC may be stored at a fixed offset from the target address of the corresponding write transaction if payload data and the associated ECC are written in separate transactions. The supplemental read transaction references the ECC at the fixed offset from the target address of the received read transaction. The supplemental read transaction is stored in the read transaction queue 164.

The read transaction tracker 166 tracks which read transactions have been supplemented to read ECCs, and in an implementation in which supplemental ECC read transactions are generated, associates transaction IDs of the received read transaction with transaction IDs of the supplemental read transactions.

If the target address is not within one of the address ranges, the read transaction is stored in the read transaction queue 164 without an accompanying ECC. The read transaction queue outputs read transactions on the read channel 186 according to the bus protocol.

When the read transaction tracker 166 receives a response to a read transaction without an ECC, the response is stored in the response queue 170. When the read transaction tracker determines that the read response has an associated ECC from the transaction ID, the response is forwarded to the ECC check circuit 168. In an implementation in which the read response includes the ECC, the read transaction tracker 166 sends the response to the ECC check circuit. In an implementation in which one read response contains the requested data and another read response contains the associated ECC, the read transaction checker 166 uses the associated transaction IDs communicated from the read transaction queue and associatively stored by the read transaction tracker to match the read response having the requested data to the proper read response having the ECC. The read transaction tracker forwards the matched responses to the ECC check circuit 168.

The ECC check circuit reads the ECC, depending on the implementation, from either the response having the requested data and ECC combined or from the response having only the ECC. The ECC check circuit 168 detects and corrects any error in the requested data using the ECC, and stores the response having the corrected data in the response queue 170. In an example implementation, the ECC check circuit detects and corrects single bit errors and detects but does not correct multiple bit errors. In response to detecting a multiple bit error in the requested data, the response stored in the response queue 170 by the ECC check circuit indicates a failure to read the requested data. Responses are transmitted from the response queue on the read response channel 188.

Figure 3:
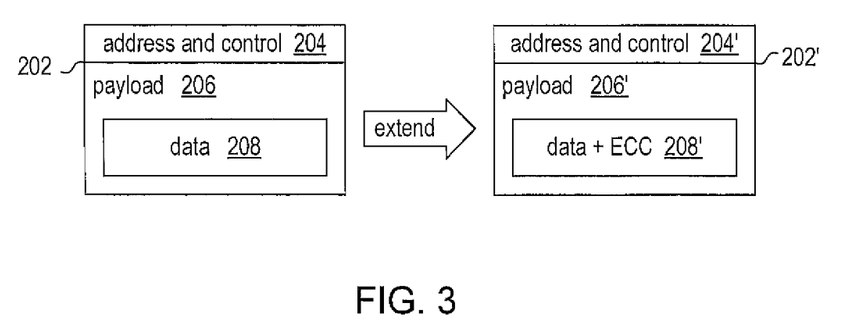
FIG. 3 shows extension of a write transaction to include an ECC.

FIG. 3 shows extension of a write transaction to include an ECC. Block 202 illustrates the information contained in an initial write transaction. The initial write transaction includes address and control information 204, along with a payload 206. The payload includes data 208. The write transaction specifies that data 208 is to be written at the target address indicated by address and control 204. The control information may indicate a transaction ID.

In extending the write transaction, the ECC is added to the data and included in the payload. Block 202' shows the extended transaction. The address in address and control 204' is changed to a new address, which is provided by the aperture check circuit 152, and the control may be modified to specify an increased byte count. The payload 206' includes a modified portion 208' that includes both data from the original transaction and the generated ECC. For example, if the bus master circuit issues write transactions for 32-bit words, and the interconnect and target memory support 64-bit words, the data may occupy 32 bits of the payload and the ECC may be placed in the other 32 bits of the payload. The ECC may be generated from only the data 208 or from a combination of the data 208 and the address and control in the initial write transaction 202.

Figure 4:
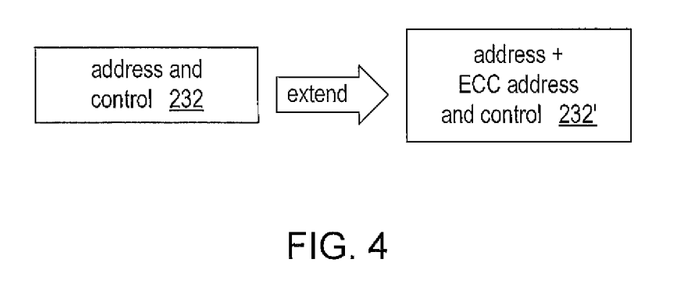
FIG. 4 shows extension of a read transaction with a reference to an ECC.

FIG. 4 shows extension of a read transaction with a reference to an ECC. Block 232 illustrates the information contained in an initial read transaction, and block 232' illustrates the read transaction supplemented to read an ECC. The address in the block 232 specifies the address from which the requested data is to be read. The control information may indicate a transaction ID and a byte count. In block 232', the address is changed to the mapped address provided by the aperture check circuit 160, and the byte count is increased to include reading of the ECC along with the data. Continuing the example above in which the bus master circuit issues transactions for 32-bit words, and the interconnect and memory support 64-bit words, the initial read transaction of block 232 may specify reading of 4 bytes. The extended read transaction of block 232' may specify reading of 8 bytes in order to read the 4 bytes of requested data and the 4 bytes of the corresponding ECC.

Figure 5:
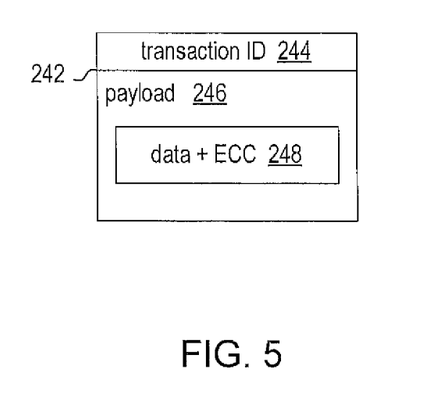
FIG. 5 shows a response to a read transaction.

FIG. 5 shows a response to a read transaction ("read response"). Block 242 illustrates the information contained in a read response. The transaction ID 244 identifies the read transaction for which the read response is returning data. The payload 246 of the read response includes the requested data and the corresponding ECC 248. For example, the data may occupy 32 bits of a 64-bit payload, and the ECC may occupy another 32 bits of the payload.

Figure 6:
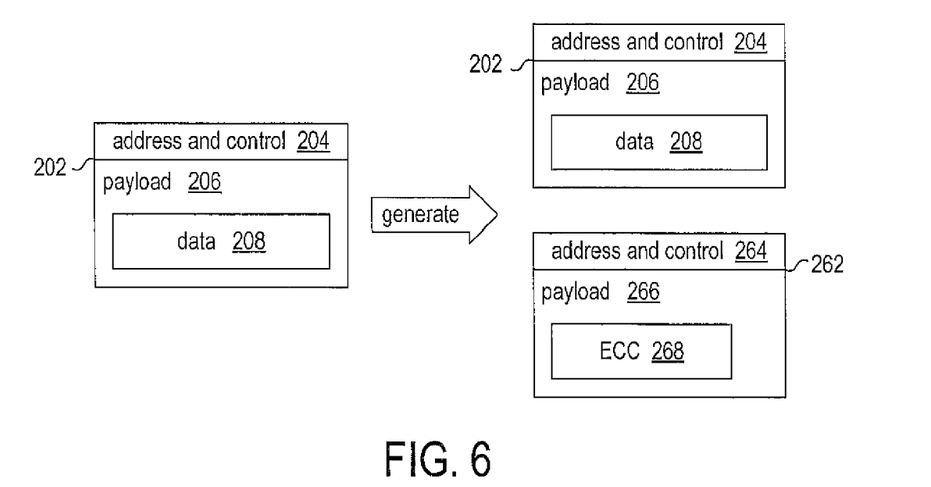
FIG. 6 shows generation of a supplemental ECC write transaction from an initial write transaction.

FIG. 6 shows generation of a supplemental ECC write transaction from an initial write transaction. Block 202 shows the information contained in an initial write transaction as described above. Block 202 is replicated in the diagram to signify that the initial write transaction is transmitted to the target memory along with the supplemental write transaction, which is shown as block 262. The address and control information 264 specifies the address at which the ECC is to be written. The payload 266 of the supplemental write transaction contains the ECC 268. The ECC may be stored in the same memory as the data 208, or in a separate memory. In an implementation in which the ECC proxy circuit has a local RAM for storing ECCs, no supplemental ECC write transaction need be generated.

Figure 7:
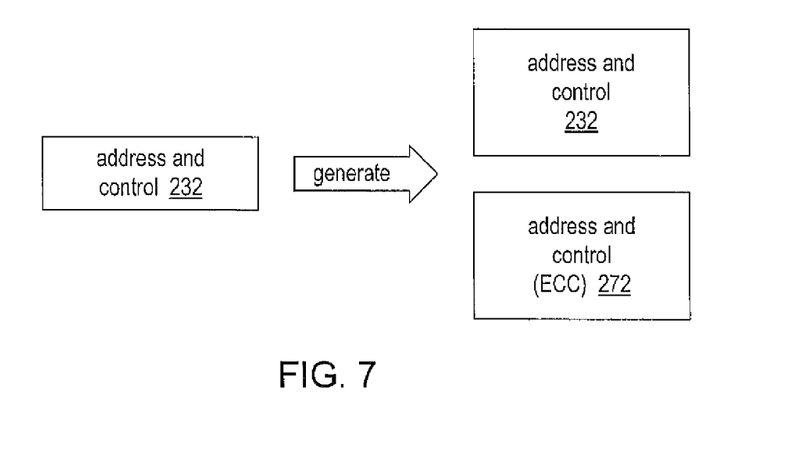
FIG. 7 shows generation of a supplemental ECC read transaction from an initial read transaction.

FIG. 7 shows generation of a supplemental ECC read transaction from an initial read transaction. Block 232 shows the information contained in an initial read transaction as described above. Block 232 is replicated in the diagram to signify that the initial read transaction is transmitted to the target memory along with the supplemental read transaction, which is shown as block 272. The address and control information of block 272 specifies the address from which the ECC is to be read. In an implementation in which the ECC proxy circuit has a local RAM for storing ECCs, no supplemental ECC read transaction need be generated.

Figure 8:
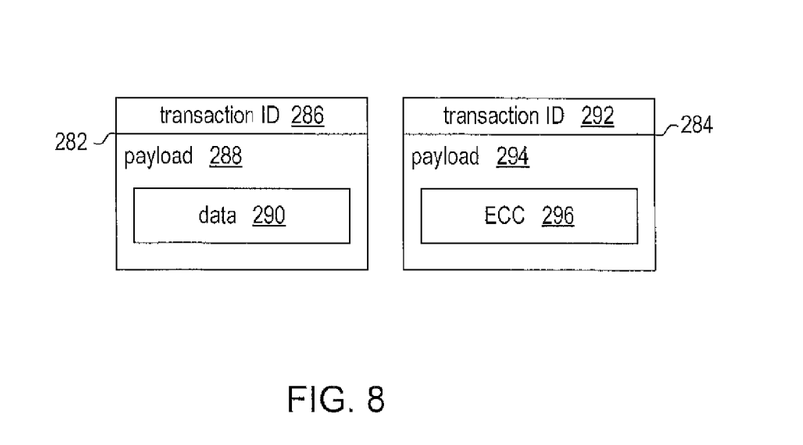
FIG. 8 shows responses to a read transaction and a supplemental read transaction.

FIG. 8 shows responses to a read transaction and a supplemental ECC read transaction. Block 282 illustrates the response to an initial read transaction, and block 284 illustrates the response to a supplemental ECC read transaction. The response to the initial read transaction includes a transaction ID 286 that matches the transaction ID in the initial read transaction, and the payload 288 includes the data 290 requested by the initial read transaction.

The response to the supplemental ECC read transaction includes the transaction ID 292 that matches the transaction ID in the supplemental ECC read transaction, and the payload 294 includes the ECC 296 associated with the data 290. The read transaction tracker 166 in the ECC proxy circuit 150 (FIG. 2) associatively stores the transaction IDs 286 and 292 in order to match the supplemental ECC read responses to the proper read response if responses are received out of order.

Figure 9:
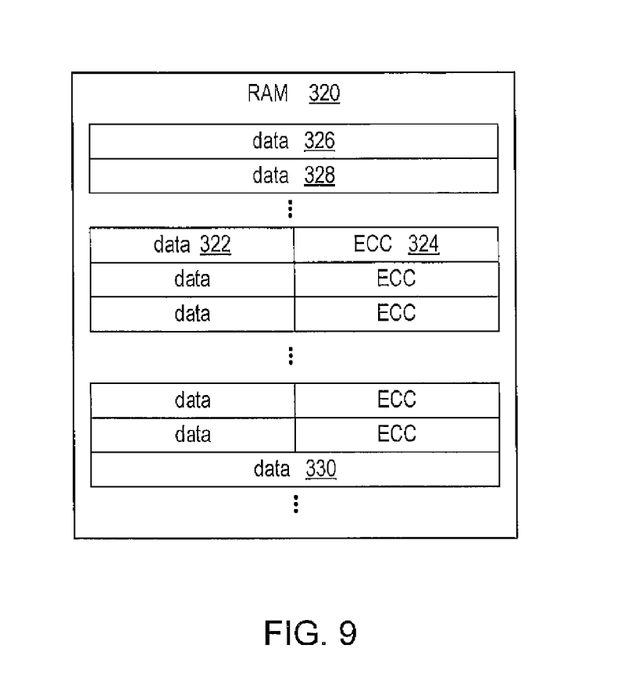
FIG. 9 shows a RAM in which both ECC-supplemented data and data not supplemented with ECCs are stored.

FIGS. 9, 10, 11, and 12 show alternative options for storing data and associated ECCs. FIG. 9 shows a RAM 320 in which both ECC-supplemented data and data not supplemented with ECCs are stored. For data supplemented with ECCs, the ECCs are stored in the same memory addresses as the data. For example, data element 322 is supplemented with ECC 324. The data element 322 and ECC 324 are stored at the same address. If RAM supports 64-bit words, the data element may be stored in 32 bits and the ECC may be stored in the other 32 bits. Data elements 326, 328, and 330 are examples of data elements not supplemented with ECCs.

Figure 10:
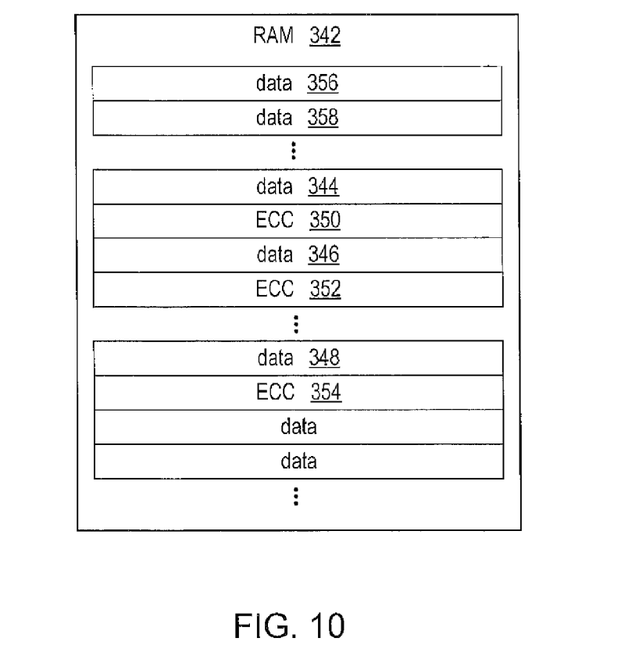
FIG. 10 shows a RAM in which data and associated ECCs from separate write transactions are stored.

FIG. 10 shows a RAM 342 in which data and associated ECCs from separate write transactions are stored. Data elements 344, 346, and 348 are examples of data having associated ECCs 350, 352, and 354, respectively, and data elements 356 and 358 are examples of data not having ECCs. The ECCs associated with the data elements are stored at an offset of one address from the data. For example, the data may be stored at even memory addresses, and the ECCs may be stored at odd memory addresses.

Figure 11:
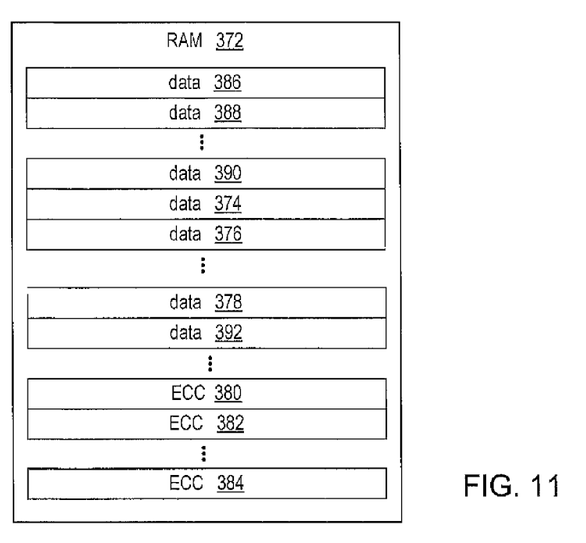
FIG. 11 shows a RAM in which data and associated ECCs from separate write transactions are stored, and the ECCs are stored in contiguous address space separate from the data.

FIG. 11 shows a RAM 372 in which data and associated ECCs from separate write transactions are stored, and the ECCs are stored in contiguous address space separate from the data. For example, data elements 374, 376, and 378 are stored in one contiguous address space, and the respectively associated ECCs 380, 382, and 384 are stored in another contiguous address space of the RAM 372. The RAM 372 may further include data that do not have associated ECCs, such as data elements 386, 388, 390, and 392.

Figure 12:
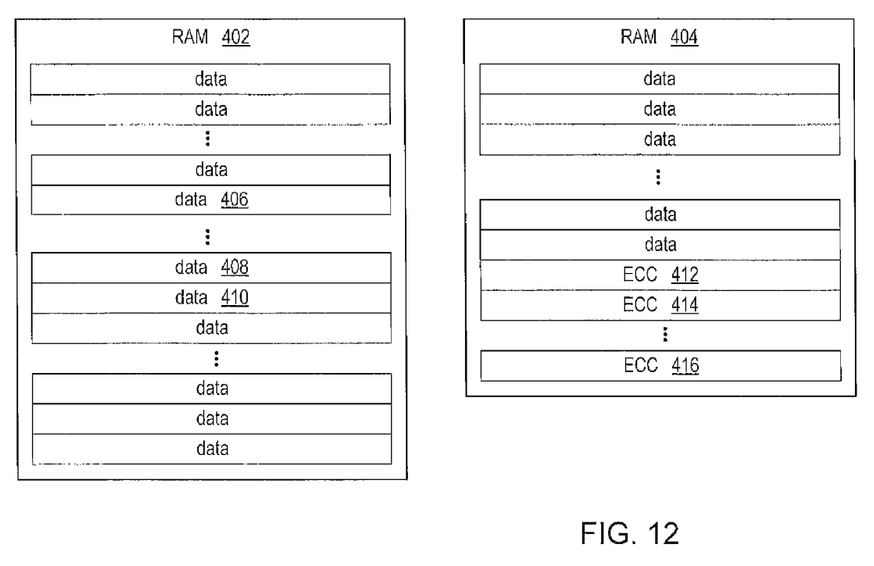
FIG. 12 shows one RAM in which data are stored and another RAM in which the corresponding ECCs are stored.

FIG. 12 shows one RAM 402 in which data are stored and another RAM 404 in which the corresponding ECCs are stored. Data elements 406, 408, and 410 are stored in RAM 402, and the respectively associated ECCs 412, 414, and 416 are stored in RAM 404. Both RAMs 402 and 404 may include data not having associated ECCs.

Figure 13:
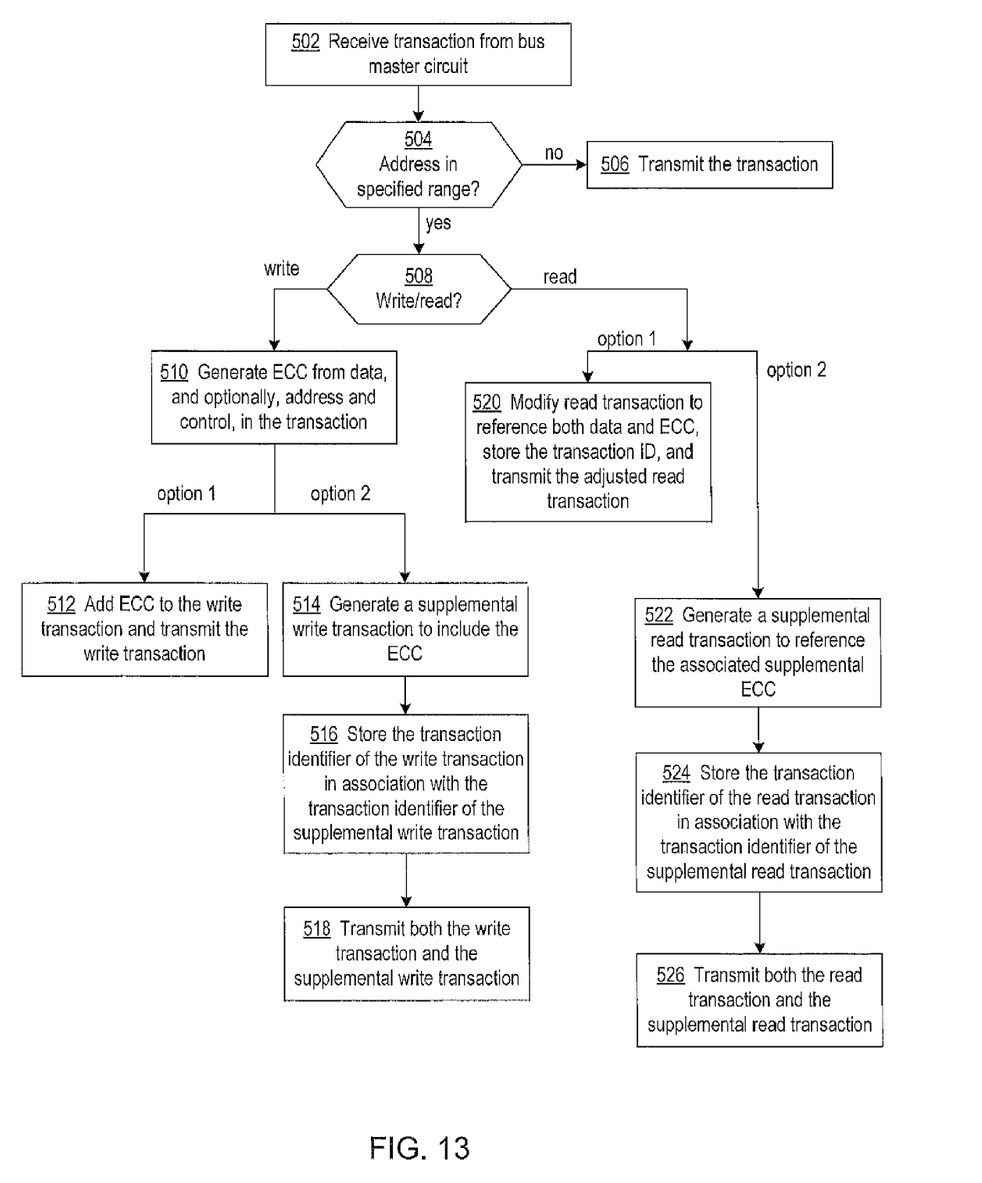
FIG. 13 shows a flowchart of a process performed by the ECC proxy circuit for read and write transactions received from a bus master circuit.

FIG. 13 shows a flowchart of a process performed by the ECC proxy circuit for read and write transactions received from a bus master circuit. At block 502, the ECC proxy circuit receives a transaction from a bus master circuit via an interconnect. Decision block 504 determines whether the target address in the transaction is within any of the specified ranges for which ECCs are to be generated or retrieved. If the address is not within any specified range, the transaction is transmitted by the ECC proxy circuit over an interconnect to a target memory at block 506. It will be appreciated that in some implementations ECCs may be generated or retrieved for all addresses, and the processing of blocks 504 and 506 may be omitted.

Decision block 508 determines whether the transaction is a write transaction or a read transaction. For a write transaction, the process proceeds to block 510, where an ECC is generated from data or from data and address and control in the write transaction.

Blocks 512 and 514 show alternative options for storing the ECC along with the associated data. At block 512, the write transaction is modified, changing the target address to the mapped address and including the generated ECC, as described above. The modified write transaction is transmitted to the target memory.

At block 514, the ECC proxy circuit generates a supplemental write transaction that includes the generated ECC. At block 516, the transaction identifier of the write transaction is stored in association with the transaction of the supplemental write transaction in local memory of the ECC proxy circuit. Both the write transaction and the supplemental write transaction are transmitted to the target memory at block 518. The original write transaction and supplemental write transaction may address separate memories as described above.

For a read transaction, decision block 508 directs the process to one of blocks 520 or 522, which show alternative options for supplementing the read transaction to read an ECC. At block 520, the process modifies the read transaction, changing the target address to the mapped address and changing the byte count to reference the ECC along with the requested data. The ECC proxy circuit stores the transaction ID to indicate a response will contain an ECC, and transmits the modified read transaction to the target memory. The read transaction may be modified by increasing the byte count specified by the transaction to include both the requested data and the associated ECC.

At block 522, a supplemental read transaction is generated. At block 524, the transaction identifier of the read transaction is stored in association with the transaction of the supplemental read transaction in local memory of the ECC proxy circuit. Both the read transaction and the supplemental read transaction are transmitted to the target memory at block 526. The supplemental read transaction specifies a target address at which the ECC associated with the data referenced by the original target transaction is stored. The original read transaction and supplemental read transaction may address separate memories as described above.

Figure 14:
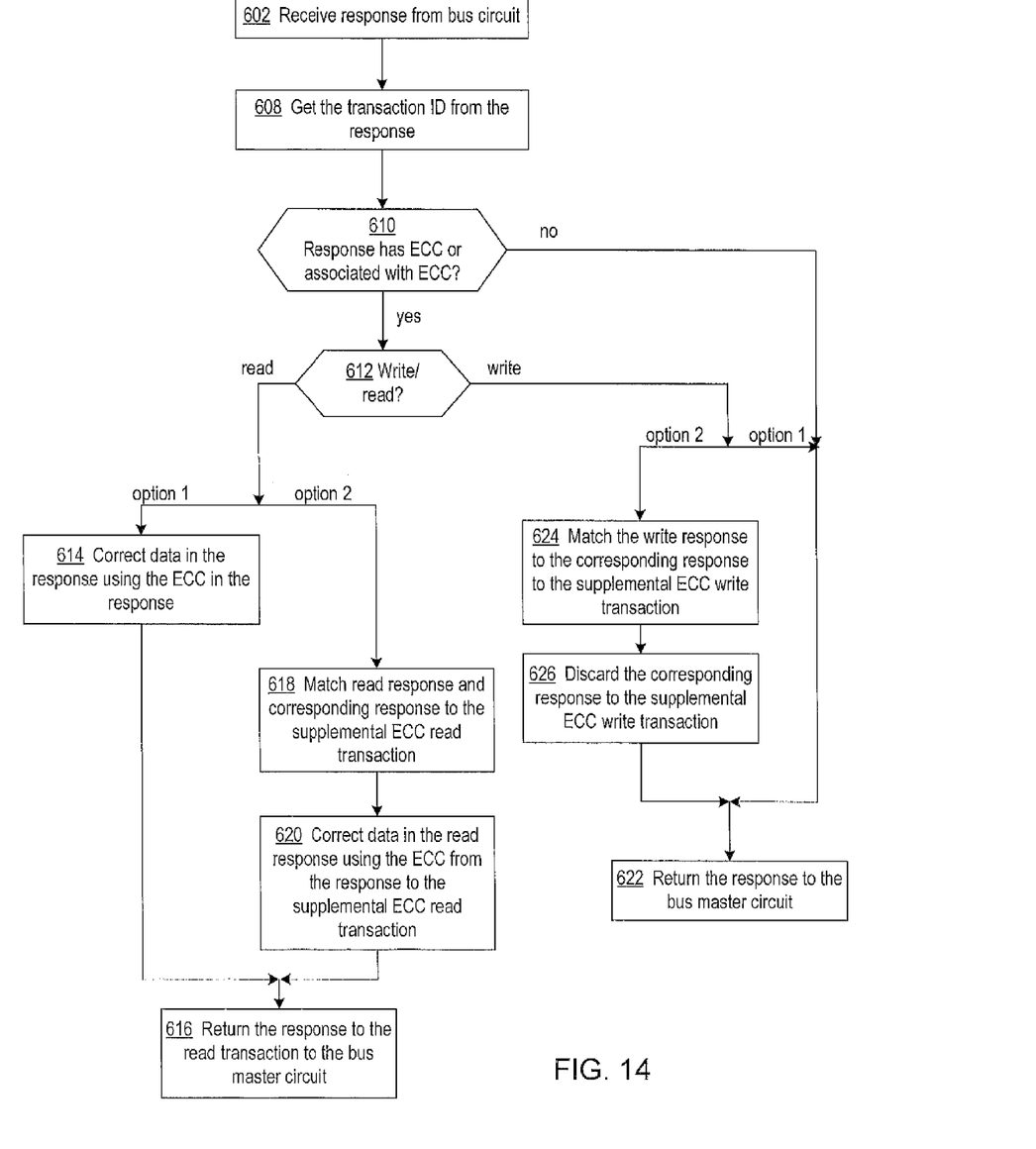
FIG. 14 shows a flowchart of a process performed by the ECC proxy circuit for responses received for read and write transactions.

FIG. 14 shows a flowchart of a process performed by the ECC proxy circuit for responses received for read and write transactions. At block 602, a response to a transaction is received by the ECC proxy circuit from an interconnect. In implementations in which supplemental ECC read and write transactions are generated, if either a response to the original transaction and or a response to the supplemental ECC transaction is returned and indicates an error, then an error code is returned by the ECC proxy circuit to the bus master circuit.

The transaction ID in the response is read at block 608, and the ECC proxy circuit determines at decision block 610 from the transaction ID whether or not the response has an ECC or is associated with another transaction that has a corresponding ECC. The ECC proxy circuit locally stores transaction IDs when a transaction is issued in order to determine when returned data has an associated ECC. If the response has or is associated with an ECC, the ECC proxy circuit continues processing at decision block 612. Otherwise, the response is returned to the bus master circuit at block 622. Note that implementations in all addresses are protected by ECCs, the processing of blocks 608 and 610 may be omitted.

Decision block 612 determines whether the response is to a write transaction or to a read transaction. According to one implementation option for a response to a read transaction, the process proceeds to block 614, which detects and corrects an error in the data of the response using the ECC that is in the response.

According to another implementation option, the process proceeds to block 618, which matches a response to an original read transaction with a response to the corresponding supplemental read transaction using the transaction identifiers that were associatively stored by the ECC proxy circuit when the original read transaction and supplemental read transaction were issued. At block 620, the ECC proxy circuit detects and corrects an error in the data in the response to the original read transaction using the ECC from the response to the corresponding supplemental read transaction. Once the data has been corrected, the response is returned to the bus master circuit at block 616, and the response to the supplemental read transaction may be discarded.

For a response to a write transaction according to implementation option 1, the response is returned to the bus master circuit at block 622. For a response to a write transaction according to implementation option 2, at block 624, the ECC proxy circuit matches a response to an original write transaction with a response to the corresponding supplemental write transaction using the transaction identifiers that were associatively stored by the ECC proxy circuit when the original write transaction and supplement write transaction were issued. The response to the supplemental write transaction is discarded at block 626, and the response to the original write transaction is returned to the bus master circuit at block 622.

Figure 15:
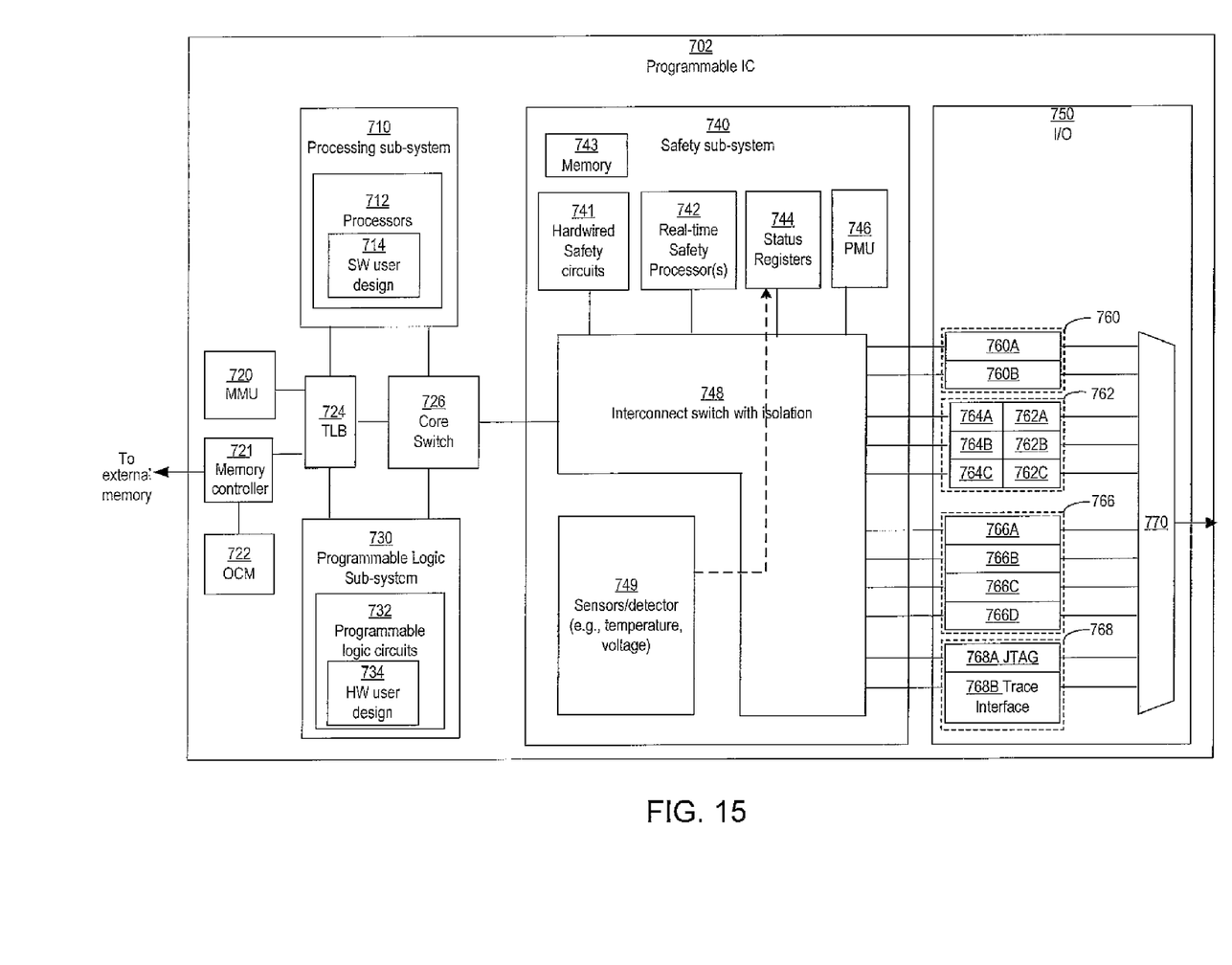
FIG. 15 shows an example of a programmable IC that may include one or more ECC proxy circuits.

FIG. 15 shows an example of a programmable IC 702 that may include one or more ECC proxy circuits as described above. For example, interconnects and ECC proxy circuits may be connected between the processing subsystem 710 and the TLB 724 and core switch 726, between the programmable logic subsystem 730 and the TLB 724 and core switch 726, or between the safety sub-system 740 and the core switch 726.

The programmable IC may also be referred to as a System-on-chip (SOC), which includes a processing subsystem 710 and a programmable logic sub-system 730. The processing sub-system 710 may be programmed to implement a software portion of the user design, via execution of a user program. The program may be specified as part of a set of configuration data or may be retrieved from an on-chip or off-chip data storage device. The processing sub-system 710 may include various processing circuits 712 for executing a software implementation of a user design 714. The processing circuits 712 may include, for example, one or more processor cores, floating point units (FPUs), an interrupt processing unit, on chip-memory, memory caches, and/or a cache coherent interconnect.

The programmable logic sub-system 730 of the programmable IC 702 may be programmed to implement a hardware portion of a user design. For instance, the programmable logic sub-system may include a number of programmable logic circuits 732, which may be programmed to implement a set of circuits specified in a set of configuration data. The programmable logic circuits 732 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable logic circuits 732 may be programmed by loading a set of configuration data into the configuration memory cells, which define how the programmable interconnect circuits and programmable logic circuits are configured. The collective states of the individual memory cells then determine the function of the programmable logic circuits 732. The configuration data can be read from memory (e.g., from an external PROM) or written into the programmable IC 702 by an external device. In some implementations, configuration data may be loaded into configuration memory cells by a configuration controller 734 included in the programmable logic sub-system 730. In some other implementations, the configuration data may be loaded into the configuration memory cells by a start-up process executed by the processing sub-system 710.

The programmable IC 702 may include various circuits to interconnect the processing sub-system 710 with circuitry implemented within the programmable logic sub-system 730. Connections between circuits and sub-systems are illustrated as lines in FIG. 7. The various connections may be single or multi-bit signal lines and may be uni-directional or bi-directional. In this example, the programmable IC 702 includes a core switch 726 that can route data signals between various data ports of the processing sub-system 710 and the programmable logic sub-system 730. The core switch 726 may also route data signals between either of the programmable logic or processing sub-systems 710 and 730 and various other circuits of the programmable IC, such as an internal data bus. Alternatively or additionally, the processing sub-system 710 may include an interface to directly connect with the programmable logic sub-system—bypassing the core switch 726. Such an interface may be implemented, for example, using the AMBA AXI Protocol Specification (AXI) as published by ARM.

In some implementations, the processing sub-system 710 and the programmable logic sub-system 730 may also read or write to memory locations of an on-chip memory 722 or off-chip memory (not shown) via memory controller 721. The memory controller 721 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 721 is able to communicate is provided for purposes of illustration only and is not intended as a limitation or to be exhaustive. As shown in FIG. 7, the programmable IC 702 may include a memory management unit 720 and translation look-aside buffer 724 to translate virtual memory addresses used by the sub-systems 710 and 730 to physical memory addresses used by the memory controller 721 to access specific memory locations.

The programmable IC may include an input/output (I/O) sub-system 750 for communication of data with external circuits. The I/O sub-system 750 may include various types of I/O devices or interfaces including for example, flash memory type I/O devices, higher performance I/O devices, lower performance interfaces, debugging I/O devices, and/or RAM I/O devices.

The I/O sub-system 750 may include one or more flash memory interfaces 760 illustrated as 760A and 760B. For example, one or more of flash memory interfaces 760 can be implemented as a Quad-Serial Peripheral Interface (QSPI) configured for 4-bit communication. One or more of flash memory interfaces 760 can be implemented as a parallel 8-bit NOR/SRAM type of interface. One or more of flash memory interfaces 760 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 750 can include one or more interfaces 762 providing a higher level of performance than flash memory interfaces 760. Each of interfaces 762A-762C can be coupled to a DMA controller 764A-764C respectively. For example, one or more of interfaces 762 can be implemented as a Universal Serial Bus (USB) type of interface. One or more of interfaces 762 can be implemented as a gigabit Ethernet type of interface. One or more of interfaces 762 can be implemented as a Secure Digital (SD) type of interface.

The I/O sub-system 750 may also include one or more interfaces 766 such as interfaces 766A-766D that provide a lower level of performance than interfaces 762. For example, one or more of interfaces 766 can be implemented as a General Purpose I/O (GPIO) type of interface. One or more of interfaces 766 can be implemented as a Universal Asynchronous Receiver/Transmitter (UART) type of interface. One or more of interfaces 766 can be implemented in the form of a Serial Peripheral Interface (SPI) bus type of interface. One or more of interfaces 766 can be implemented in the form of a Controller-Area-Network (CAN) type of interface and/or an I²C type of interface.

The I/O sub-system 750 can include one or more debug interfaces 768 such as processor JTAG (PJTAG) interface 768A and a trace interface 768B. PJTAG interface 768A can provide an external debug interface for the programmable IC 702. Trace interface 768B can provide a port to receive debug, e.g., trace, information from the processing sub-system 710 or the programmable logic sub-system 730.

As shown, each of interfaces 760, 762, 766, and 768 can be coupled to a multiplexer 770. Multiplexer 770 provides a plurality of outputs that can be directly routed or coupled to external pins of the programmable IC 702, e.g., balls of the package within which the programmable IC 702 is disposed. For example, I/O pins of programmable IC 702 can be shared among interfaces 760, 762, 766, and 768. A user can configure multiplexer 770, via a set of configuration data to select which of interfaces 760-768 are to be used and, therefore, coupled to I/O pins of programmable IC 702 via multiplexer 770. The I/O sub-system 750, may also include a fabric multiplexer I/O (FMIO) interface (not shown) to connect interfaces 762-768 to programmable logic circuits of the programmable logic sub-system. Additionally or alternatively, the programmable logic sub-system 730 can be configured to implement one or more I/O circuits within programmable logic. In some implementations, the programmable IC 702 may also include a sub-system 740 having various circuits for power and/or safety management. For example, the sub-system 740 may include a power management unit 746 configured to monitor and maintain one or more voltage domains used to power the various sub-systems of the programmable IC 702. In some implementations, the power management unit 746 may disable power of individual sub-systems, when idle, to reduce power consumption, without disabling power to sub-systems in use.

The sub-system 740 may also include safety circuits to monitor the status of the sub-systems to ensure correct operation. For instance, the sub-system 740 may include one or more hard-wired safety circuits 741 configured to perform safety functions for various sub-systems or circuits of the programmable IC. The sub-system 740 may also include one or more real-time processors 742 configured to execute various software-based safety functions for various sub-systems or circuits of the programmable IC.

The sub-system 740 may include one or more sensors or detectors 749 configured to monitor various operating parameters of the programmable IC (e.g., voltage, temperature, clocks and/or data/control signals) and store data indicating the status of the monitored operating parameters in status registers 744. Data flow from the sensors or detectors 749 to the status registers via interconnect switch 748 is illustrated by a dashed line in FIG. 7. The status registers may be accessed, by the hard-wired safety circuits 741, real-time processors 742, or power management unit 746.

The safety functions may monitor the status of the various sub-systems and perform various actions to facilitate detection, prevention, and/or mitigation of errors in one or more sub-systems or circuits. In some implementations, the safety functions may take action in response to the status registers having values indicative of an error. For example, a safety function may generate an alert in response to detecting an error. As another example, a safety function may reset an individual sub-system to attempt to restore the sub-system to correct operation, as discussed with reference to FIGS. 1 and 2.

Sub-systems or circuits to be monitored and conditions in which sub-systems are to be reset may be specified in a safety policy stored in a memory 743. The safety policy performed by the safety sub-system may be hardcoded in a non-volatile memory or may be stored in the memory at startup. In some implementations, the safety policy may be user configurable and provided, for example, in a subset of a set of configuration data.

The sub-system 740 includes an interconnect switch network 748 that may be used to interconnect various sub-systems. For example, the interconnect switch network 748 may be configured to connect the various sub-systems 710, 730, and 740 to various interfaces of the I/O sub-system 750. In some applications, the interconnect switch network 748 may also be controlled by one or more safety functions of the hard-wired safety circuits 741 or real-time safety processors 742 to isolate the real-time processors 742 from the sub-systems that are to be monitored. Such isolation may be required by certain application standards (e.g., IEC-61508 SIL3 or ISO-26262 standards) to ensure that the real-time processors 742 are not affected by errors that occur in other sub-systems. In some applications, interconnect switch network 748 may also be protected (e.g., by ECC or parity) to provide protection against random faults. In some applications, the interconnect switch network 748 may be protected by software-based tests that are periodically performed to test the interconnect switch network 748.

In some implementations, some safety functions may be performed by redundant hard-wired circuits of the hard-wired safety circuits 741. For example, the power management unit 746 may be protected by a safety function performed by a triple modular redundant circuit of the hardwired safety circuits 741. For example, the hard-wired circuits of the safety sub-system may include a triple modular redundant circuit configured to monitor a power management unit of the programmable IC. As another example, the programmable IC may include a configuration security unit configured to prevent unintended reconfiguration of programmable logic circuits (e.g., during reset of the processing sub-system 710). The configuration security unit may similarly be protected by triple modular redundant circuits.

Though aspects and features may in some cases be described in individual figures, it will be appreciated that features from one figure can be combined with features of another figure even though the combination is not explicitly shown or explicitly described as a combination.

The methods and systems are thought to be applicable to a variety of systems. Other aspects and features will be apparent to those skilled in the art from consideration of the specification. It is intended that the specification and drawings be considered as examples only, with a true scope of the invention being indicated by the following claims.

What is claimed is:

1. A circuit arrangement, comprising:
   a first bus master circuit, the first bus master circuit configured and arranged to initiate read transactions and write transactions;
   a first interconnect coupled to the first bus master circuit;
   a second interconnect; and
   an error correcting code (ECC) proxy circuit coupled between the first interconnect and the second interconnect, the ECC proxy circuit configured and arranged to,
      generate, in response to each of the write transactions, a first ECC from and associated with data of the write transaction, and transmit the write transaction and associated first ECC on the second interconnect,
      supplement, in response to each of the read transactions, the read transaction with a reference to a second ECC associated with data referenced by the read transaction, and transmit the read transaction that references the second ECC on the second interconnect; and
   at least one random access memory (RAM) coupled to the ECC proxy circuit through the second interconnect and configured and arranged to store data of each write transaction and the first ECC, and read the data referenced by each read transaction and the second ECC.

2. The circuit arrangement of claim 1, wherein the ECC proxy circuit is further configured and arranged to:
   modify the write transaction to include the first ECC; and
   modify the read transaction to address the data of the read transaction and the second ECC.

3. The circuit arrangement of claim 1, wherein the ECC proxy circuit is further configured and arranged to:
   generate a supplemental write transaction that includes the first ECC and designates a target address different from a target address of the write transaction, and transmit the supplemental write transaction to the at least one RAM; and
   generate a supplemental read transaction that designates a target address of the second ECC, and transmit the supplemental read transaction to the at least one RAM.

4. The circuit arrangement of claim 3, wherein:
   the at least one RAM includes at least a first RAM and a second RAM;
   the target address of the write transaction references the first RAM, and the target address of the supplemental write transaction references the second RAM; and
   the target address of the read transaction references the first RAM, and the target address of the supplemental read transaction references the second RAM.

5. The circuit arrangement of claim 3, wherein the ECC proxy circuit is further configured and arranged to:
   receive from the at least one RAM, a first read response to the read transaction and a second read response to the supplemental read transaction;
   correct data in the first read response using the second ECC from the second read response; and
   transmit the first read response to the first bus master circuit after correction of the data.

6. The circuit arrangement of claim 1, wherein the ECC proxy circuit is further configured and arranged to:
   receive from the at least one RAM, a read response to the read transaction;
   correct data in the read response using the second ECC; and
   transmit the read response to the first bus master circuit after correction of data in the read response.

7. The circuit arrangement of claim 1, wherein the ECC proxy circuit includes a memory circuit that is configurable to store addresses of at least one address range of the at least one RAM, and the ECC proxy circuit is further configured and arranged to:
   generate the first ECC in response to an address referenced by the write transaction being within the at least one address range;
   bypass generation of the first ECC in response to the address referenced by the write transaction being outside the at least one address range;
   supplement the read transaction in response to an address referenced by the read transaction being within the at least one address range; and
   bypass supplementation of the read transaction in response to the address referenced by the read transaction being outside the at least one address range.

8. The circuit arrangement of claim 7, wherein the ECC proxy circuit is further configured and arranged to, generate the first ECC from address and control signals and the data of the write transaction.

9. The circuit arrangement of claim 1, wherein the ECC proxy circuit is further configured and arranged to, generate the first ECC from address and control signals and the data of the write transaction.

10. The circuit arrangement of claim 1, further comprising:
    a second bus master circuit coupled to the first interconnect, the second bus master circuit configured and arranged to initiate read transactions and write transactions; and
    wherein the ECC proxy circuit is further configured and arranged to,
       generate, in response to each of the write transactions from the second bus master circuit, a third ECC from and associated with data of the write transaction, and transmit the write transaction and associated third ECC on the second interconnect, and
       supplement, in response to each of the read transactions from the second bus master circuit, the read transaction with a reference to a fourth ECC associated with data referenced by the read transaction, and transmit the read transaction that references the fourth ECC on the second interconnect.

11. A method of processing bus transactions, comprising:
transmitting read transactions and write transactions from a first bus master circuit over a first interconnect coupled to the first bus master circuit;
receiving the read and write transactions by an error correcting code (ECC) proxy circuit coupled between the first interconnect and a second interconnect;
generating by the ECC proxy circuit, in response to each of the write transactions, a first ECC from and associated with data of the write transaction, and transmitting the write transaction and associated first ECC on the second interconnect;
supplementing by the ECC proxy circuit, in response to each of the read transactions, the read transaction with a reference to a second ECC associated with data referenced by the read transaction, and transmitting the read transaction that references the second ECC on the second interconnect;
storing data of the write transaction and the first ECC in at least one random access memory (RAM) coupled to the ECC proxy circuit through the second interconnect; and
reading data referenced by the read transaction and the second ECC from the at least one RAM.

12. The method of claim 11, further comprising:
modifying the write transaction by the ECC proxy circuit to include the first ECC; and
modifying the read transaction by the ECC proxy circuit to address the data of the read transaction and the second ECC.

13. The method of claim 11, further comprising:
generating by the ECC proxy circuit a supplemental write transaction that includes the first ECC and designates a target address different from a target address of the write transaction, and transmitting the supplemental write transaction to the at least one RAM; and
generating by the ECC proxy circuit a supplemental read transaction that designates a target address of the second ECC, and transmitting the supplemental read transaction to the at least one RAM.

14. The method of claim 13, wherein:
the at least one RAM includes at least a first RAM and a second RAM;
the target address of the write transaction references the first RAM, and the target address of the supplemental write transaction references the second RAM; and
the target address of the read transaction references the first RAM, and the target address of the supplemental read transaction references the second RAM.

15. The method of claim 13, further comprising:
receiving by the ECC proxy circuit from the at least one RAM, a first read response to the read transaction and a second read response to the supplemental read transaction;
correcting data in the first read response by the ECC proxy circuit using the second ECC from the second read response; and
transmitting the first read response from the ECC proxy circuit to the first bus master circuit after correction of the data.

16. The method of claim 11, further comprising:
receiving by the ECC proxy circuit from the at least one RAM, a read response to each read transaction;
correcting data in the read response by the ECC proxy circuit using the second ECC; and
transmitting the read response from the ECC proxy circuit to the first bus master circuit after correction of data in the read response.

17. The method of claim 11, wherein the ECC proxy circuit includes a memory circuit, the method further comprising:
storing addresses of at least one address range of the at least one RAM in the memory circuit;
generating by the ECC proxy circuit the first ECC in response to an address referenced by the write transaction being within the at least one address range;
bypassing generation of the first ECC in response to the address referenced by the write transaction being outside the at least one address range;
supplementing the read transaction in response to an address referenced by the read transaction being within the at least one address range; and
bypassing supplementation of the read transaction in response to the address referenced by the read transaction being outside the at least one address range.

18. The method of claim 17, further comprising generating by the ECC proxy circuit, the first ECC from address and control signals and the data of the write transaction.

19. The method of claim 11, further comprising generating by the ECC proxy circuit the first ECC from address and control signals and the data of the write transaction.

20. The method of claim 11, further comprising:
transmitting read transactions and write transactions from a second bus master circuit over the first interconnect coupled to the second bus master circuit;
generating by the ECC proxy circuit, in response to each of the write transactions from the second bus master circuit, a third ECC from and associated with data of the write transaction, and transmitting the write transaction and associated third ECC on the second interconnect; and
supplementing by the ECC proxy circuit, in response to each of the read transactions from the second bus master circuit, the read transaction with a reference to a fourth ECC associated with data referenced by the read transaction, and transmitting the read transaction that references the fourth ECC on the second interconnect.

* * * * *